United States Patent
Xie et al.

US008022708B2

(10) Patent No.: US 8,022,708 B2
(45) Date of Patent: Sep. 20, 2011

(54) FIBER OPTIC FAULT DETECTION SYSTEM AND METHOD FOR UNDERGROUND POWER LINES

(75) Inventors: Huikai Xie, Gainesville, FL (US); David Clark Gibson, Gainesville, FL (US); Darko Kovac, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 355 days.

(21) Appl. No.: 12/517,590

(22) PCT Filed: Dec. 6, 2007

(86) PCT No.: PCT/US2007/086623
§ 371 (c)(1),
(2), (4) Date: Jun. 4, 2009

(87) PCT Pub. No.: WO2008/070766
PCT Pub. Date: Jun. 12, 2008

(65) Prior Publication Data
US 2010/0007352 A1    Jan. 14, 2010

Related U.S. Application Data

(60) Provisional application No. 60/873,525, filed on Dec. 7, 2006.

(51) Int. Cl.
*G01R 31/00* (2006.01)
(52) U.S. Cl. ........................................ 324/501; 324/512
(58) Field of Classification Search .................. 324/501, 324/512
See application file for complete search history.

(56) References Cited

U.S. PATENT DOCUMENTS

| 4,298,794 | A | 11/1981 | Snitzer et al. |
| 5,125,738 | A | 6/1992 | Kawamura et al. |
| 5,493,390 | A | 2/1996 | Varasi et al. |
| 2005/0201761 | A1* | 9/2005 | Bartur et al. .................. 398/197 |

FOREIGN PATENT DOCUMENTS

| EP | 0466155 | 1/1992 |
| EP | 1496369 | 1/2005 |
| JP | 59131177 | 7/1984 |

OTHER PUBLICATIONS

Kalinowski, H.J., et al., "Multiplexed Fiber Optics Bragg Grating Sensors for Strain and Temperature Measurements In Power Systems", *Proceedings of the SPIE—The International Society for Optical Engineering*, Bellingham, VA, USA, Jan. 1, 1999, pp. 544-553, vol. 3666.

* cited by examiner

*Primary Examiner* — Vincent Q Nguyen
(74) *Attorney, Agent, or Firm* — Saliwanchik, Lloyd & Eisenschenk (57) ABSTRACT

Embodiments of the present invention are directed to a method and fault detection system for detecting and identifying the location of faults in underground power lines that can effectively and quickly identify faults in underground power lines. Embodiments can provide a method and fault detection system that quickly identify faults in a power grid that result from open circuits or short circuits in underground conduits. A specific system for fault detection of power lines in a network having one or more substations and corresponding one or more manholes for access to underground lines, includes: a sensor device for each manhole, wherein the sensor device is capable of detecting a magnetic field generated by a power line and can send a signal through a fiber optic cable, the signal including a unique wavelength identifier; and a communication device for each substation for transmitting the signal from the sensor device to an operator.

38 Claims, 6 Drawing Sheets

FIBER OPTIC FAULT DETECTION SYSTEM AND METHOD FOR UNDERGROUND POWER LINES

CROSS-REFERENCE TO RELATED APPLICATION

The present application is the U.S. National Stage Application of International Patent Application No. PCT/US2007/086623, filed on Dec. 6, 2007, which claims the benefit of U.S. Provisional Patent Application Ser. No. 60/873,525, filed Dec. 7, 2006, both of which are hereby incorporated by reference herein in their entirety, including any figures, tables, or drawings.

BACKGROUND OF INVENTION

Electric power can be distributed to customers through overhead lines, underground lines, or a combination of overhead and underground lines. Faults can occur in the power lines and cause a loss of power to customers. These faults can be a result of an open circuit or a short circuit (e.g., where two phases touch each other). As an example, when a power line has a short, the power supply will stop and leave many customers without power. In the case of the overhead lines, because the lines are visible, the detection of a problem can be easier, and in many instances customers will point the problem out.

However, with underground lines the problem of detection is much more complex. When a short occurs there is little or no indication at the surface, except on a rare occasion of a blown manhole. Accordingly, it can be difficult to identify the line or lines that have a fault. In fact, often the majority of the repair time is wasted on finding the location of the fault.

Often techniques such as reflectometry or time-delayed analysis are used to find the location of a fault. One of such techniques uses an application of a high voltage to an underground cable to break down the insulation defect and induce a transient fault pulse to propagate through the cable to the end. For example, one method for locating a fault that has occurred in an electric power cable in relationship to one or more known locations along the cable includes the steps of applying a high voltage of a predetermined polarity in the cable on one side of the fault to induce the transient fault pulse; sensing the transient fault pulse at two known locations on either side of the fault; determining the pulse direction at each sensing location; and if the directions are opposite recognizing that the fault is between the two sensing locations. Even techniques involving sensors tend to incorporate time delay or reflectometry methods. Moreover, methods involving RF transmitters to send the sensor signals to a central station can have electromagnetic interference from the power lines themselves.

Another common method of detecting a short circuit is to use a ground probe to search for maximum signal strength. Here, the maximum current point will be nearest to the fault. There are three basic methods that might be used to show the direction to fault: DC shift; cable carrier and/or locked carrier reference; and phase deviation. The DC shift method involves either placing a large DC voltage on the cable or using a large pseudo impulse. The method using cable carrier and/or locked carrier reference involves locking an on-board reference to the transmitter. This can be most easily achieved by sending a carrier signal down the same cable and picking it up with an antenna. Alternatively, a radio based carrier system could be used. Another method is to lock the receiver to the transmitter and hold the lock using a very low drift oscillator. The phase deviation method involves using more than one frequency and measuring the direction of phase deviation between the two signals. If the direction of deviation is one polarity, then the fault lies in one direction, otherwise it lies in the other. However, these methods require time to find the fault's location.

Therefore, there is a need for a method and fault detection system for detecting and identifying the location of faults in underground power lines that can effectively and quickly identify faults in underground power lines.

BRIEF SUMMARY

Embodiments of the present invention are directed to a method and fault detection system for detecting and identifying the location of faults in underground power lines that can effectively and quickly identify faults in underground power lines. Embodiments can provide a method and fault detection system that quickly identify faults in a power grid that result from open circuits or short circuits in underground conduits.

A specific system for fault detection of power lines in a network having one or more substations and corresponding one or more manholes for access to underground lines, includes: a sensor device for each manhole, wherein the sensor device is capable of detecting a magnetic field generated by a power line and can send a signal through a fiber optic cable, the signal including a unique wavelength identifier; and a communication device for each substation for transmitting the signal from the sensor device to an operator.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

DETAILED DISCLOSURE

Embodiments of the present invention are directed to a method and fault detection system for detecting and identifying the location of faults in underground power lines that can effectively and quickly identify faults in underground power lines. Embodiments can provide a method and fault detection system that quickly identify faults in a power grid that result from open circuits or short circuits in underground conduits.

A specific system for fault detection of power lines in a network having one or more substations and corresponding one or more manholes for access to underground lines, includes: a sensor device for each manhole, wherein the sensor device is capable of detecting a magnetic field generated by a power line and can send a signal through a fiber optic cable, the signal including a unique wavelength identifier; and a communication device for each substation for transmitting the signal from the sensor device to an operator.

Figure 1:
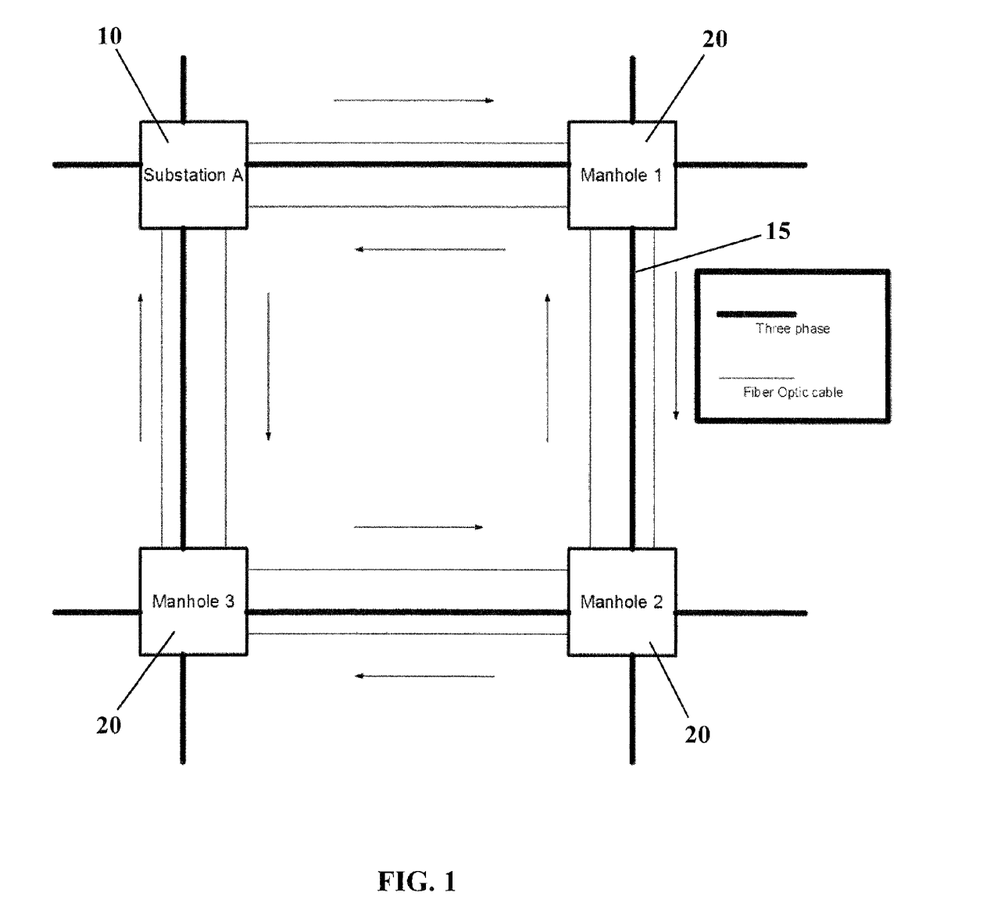
FIG. 1 shows a portion of a power grid system according to an embodiment of the subject invention.

FIG. 1 shows a power grid system incorporating power line fault detection according to an embodiment of the subject invention. In an embodiment, the grid can include substation A 10. Substation A 10 can be connected by three-phase current lines 15. Manholes 20 can be arranged at intervals along the grid for access to underground lines. In one embodiment, each manhole 20 can have a sensor device for detecting lack of current flow and a transmission device for alerting an operator and/or monitoring system at a control center of a line failure. Such transmission devices for alerting an operator and/or monitoring system can utilize an LED, laser diode, or other device to generate an optical signal to be transmitted via an optical fiber. Sensor devices can also be positioned at intervals on or above ground. The power grid system of a network can be divided into multiple zones characterized by one or more substations.

Figure 2:
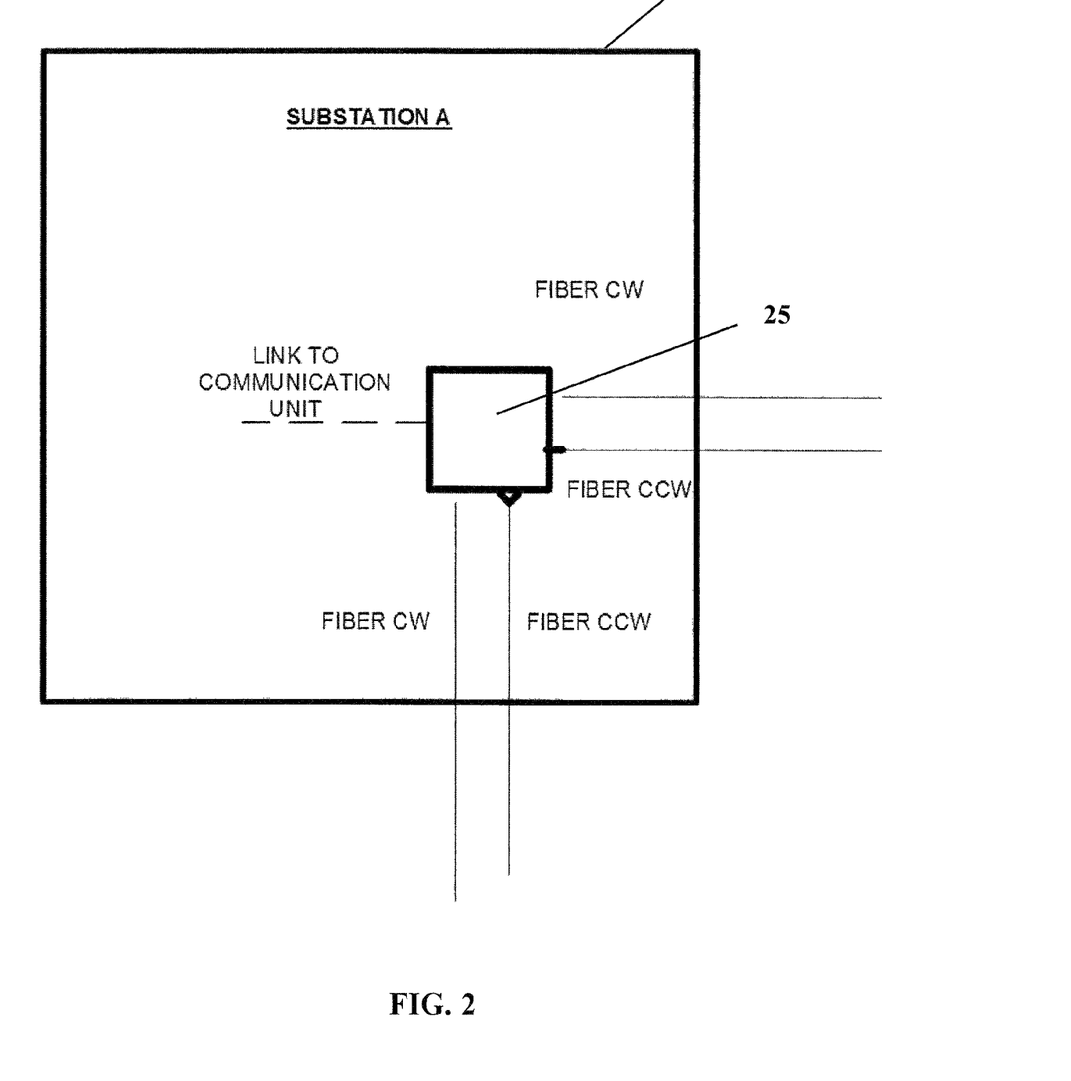
FIG. 2 shows a substation according to an embodiment of the subject invention.

Referring to FIG. 2, a substation 10 can include a substation connector 25 for connecting fiber optic cable lines of optical fibers. The substation connector 25 can incorporate a sensor unit that takes as input the fiber optic cable lines. The sensor unit can include a photodetector such as a PIN diode. In one embodiment a clockwise (CW) loop can be used to connect sensor devices to the substation connector 25. In a further embodiment, a counterclockwise (CCW) loop can be used to connect sensor devices to the substation connector 25 as a failsafe. Both the CW loop and the CCW loop can be used for added security in case of a failure of one of the sensors. The substation connector 25 can be connected to a communication unit to alert an operator of a line failure. The communication unit can be in a main control room. The optical fibers can be used as a medium for the entire communication system. A sensor device can detect a failure of the current and a signal can be coupled to the optical fiber. The sensor unit of the substation can receive the signal sent from the sensor device and forward that signal to a communication unit, and the communication unit can transmit the signal to an operator and/or monitoring system of the control center. In a specific embodiment, the optical fibers according to an embodiment of the subject invention can be used both as signal carriers and as sensors. For example, the optical fibers can be used a distributed temperature sensor that detects the temperature variations along the power cables. One method of detecting distributed temperature is to use Stokes and/or anti-Stokes Raman scattering and laser pulses.

Figure 3:
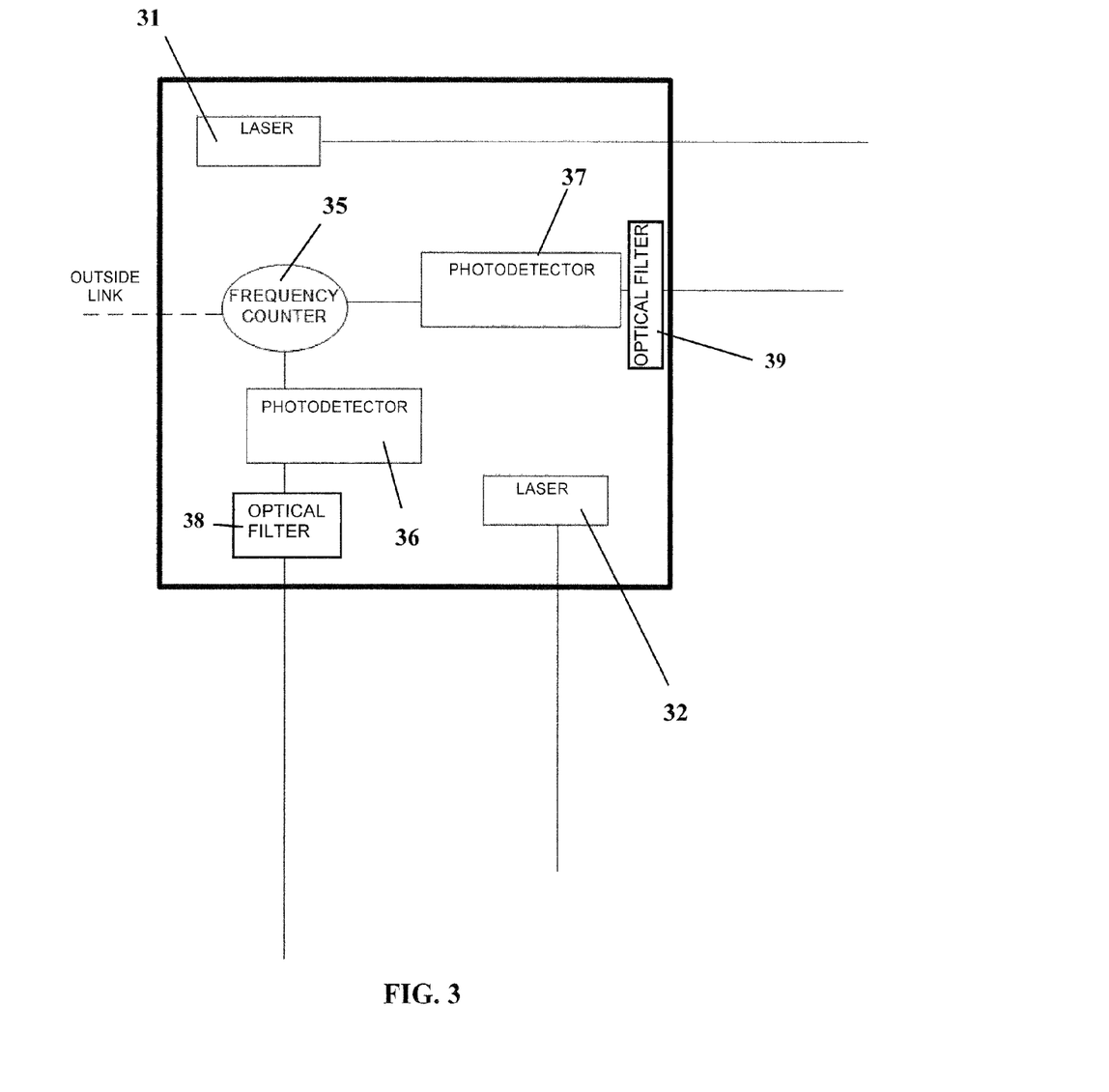
FIG. 3 shows a substation connector layout according to an embodiment of the subject invention.

FIG. 3 shows an embodiment of a substation connector 25. The substation connector 25 can incorporate a first laser 31, a second laser 32, a frequency counter 35, a first photodetector 36, a second photodetector 37, a first optical filter 38, and a second optical filter 39. The optical signal is transmitted via the optical fiber from a neighboring manhole to the substation where the optical signal is first filtered through an optical filter and then is detected by a photodetector. The frequency of the output signal of the photodetector is then counted by a frequency counter circuit. In an embodiment, each manhole can have a designated frequency value as its unique identification. In one embodiment, the first and/or second laser can be an LED or other light generating device. In operation, the first and/or second photodetector can detect the lack of current flow in a power line and then activate the LED or laser. The LED or laser can transmit the specific signature frequency for that manhole and signature frequencies of other manholes in that substation to a monitoring system located at, for example, the central control unit.

Figure 4:
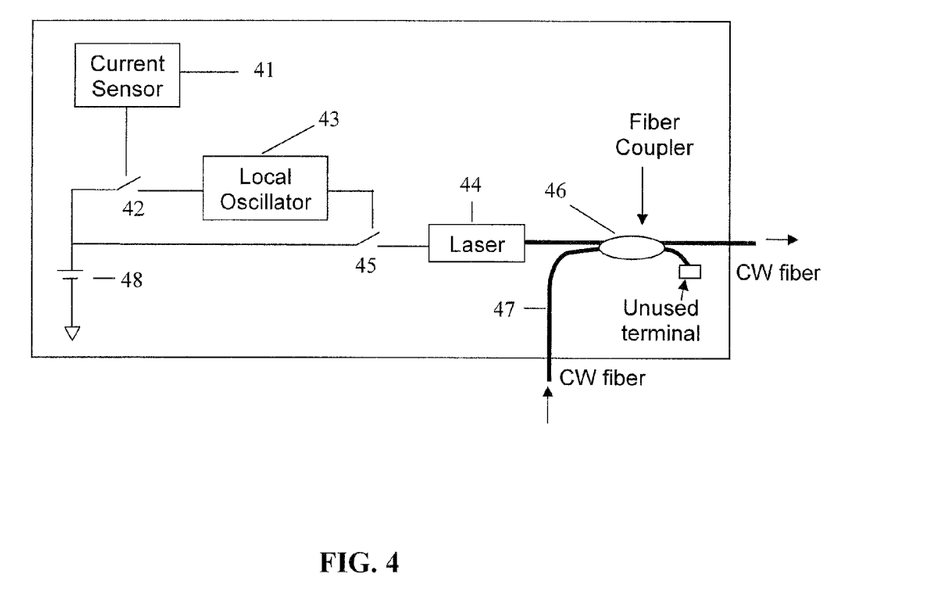
FIG. 4 shows a sensor device layout according to an embodiment of the subject invention.

FIG. 4 shows a schematic of an embodiment of a sensor device. In the embodiment as shown in FIG. 4, the sensor device can incorporate a current sensor 41, sensor controlled switch 42, local oscillator 43, optic source 44, optic source switch 45, fiber coupler 46, optical fibers 47, and power supply 48. In an embodiment, the design of the current sensor can rely on the detection of magnetic field fluctuations. The power supply 48 can be a battery. The power can also be, partially or wholly, harvested locally by converting the electromagnetic radiation of the power lines, making the system self-powered.

The local oscillator can generate a specific signature frequency for each manhole. The specific signature frequency allows an operator to determine the specific location of power failure or lack of current flow. In a further embodiment, the sensor device can have a standby mode for when the power lines are operational. In standby mode a test signal can be used to notify an operator that the system continues to be operational. In an embodiment, the test-signal can fire at preset time intervals. In a specific embodiment, the preset time interval can be every few minutes.

In one embodiment, the sensor device can detect the current flow or lack thereof in a power line by the use of a magnetic field sensor capable of detecting magnetic fields generated by an energized power cable. In another embodiment, an electric field sensor device can be used to detect current flow in the power line.

The optic source, such as a LED or laser, can provide a specific color wavelength corresponding to the sensor device's position within the network. In another embodiment, a local oscillator or digital clock generator can be used to generate a specific frequency that can be used to represent a specific manhole. As an example, each manhole can be assigned a unique frequency. In a further embodiment, each zone having at least one substation and one or more manholes can be assigned a specific color wavelength.

Figure 5:
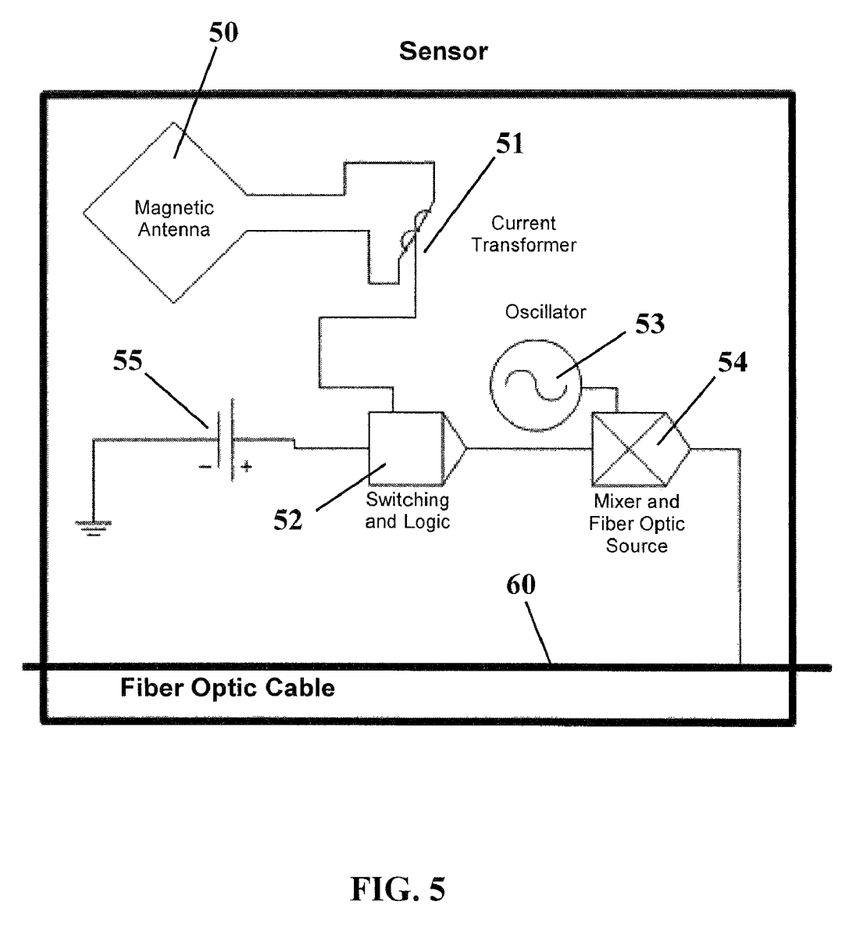
FIG. 5 shows a magnetic field sensor according to an embodiment of the subject invention.

FIG. 5 shows a schematic of an embodiment of a magnetic field sensor device. In the embodiment as shown in FIG. 5, the magnetic field sensor device can incorporate a magnetic antenna 50, current transformer 51, switching and logic 52, oscillator 53, mixer and fiber optic source 54, and power supply 55. The design of the magnetic field sensor device can rely on the detection of magnetic field fluctuations. As distribution lines are typically designed to contain their electric field, the magnetic field can be used for monitoring the status of the lines. In a specific embodiment, the sensor device can contain a loop antenna, which can be oriented to allow the magnetic field lines to pass through. The power supply 55 can include an on-board battery for operating the sensor device once a fault has occurred.

Figure 6:
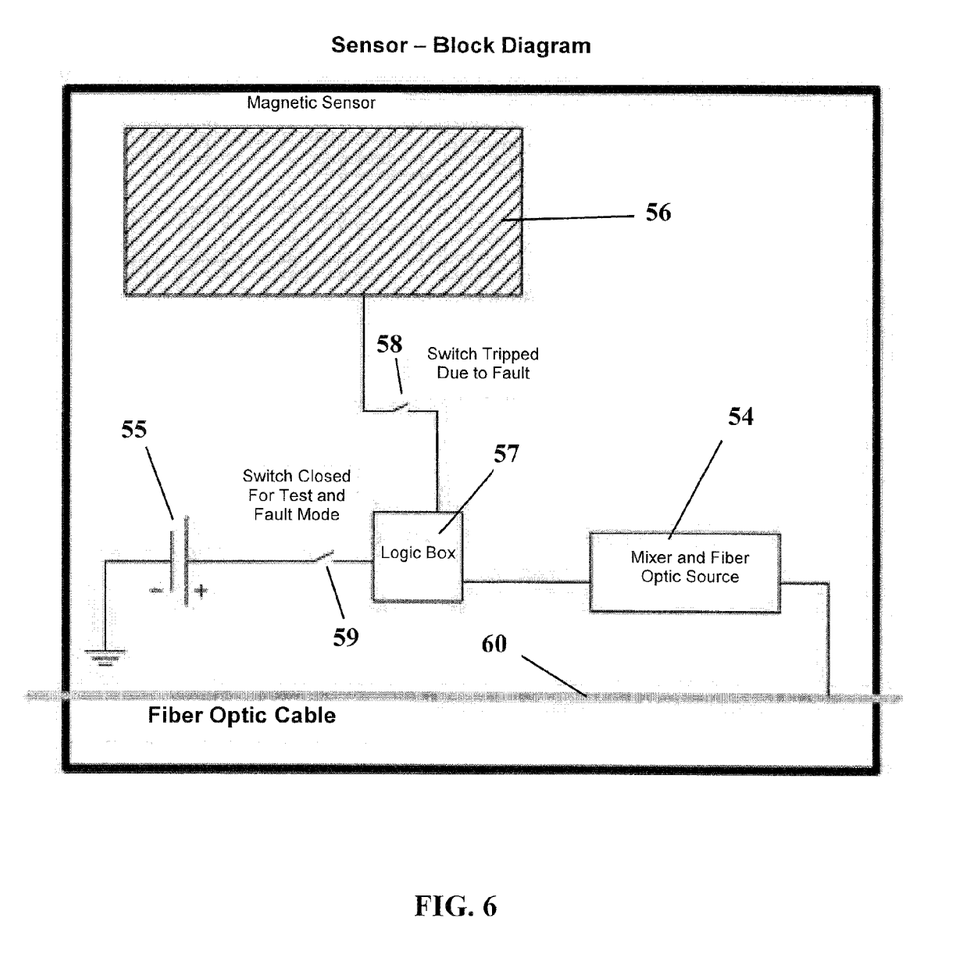
FIG. 6 shows a block diagram of sensor modes according to an embodiment of the subject invention.

The switching and logic 52 can control what mode the sensor device is in. Referring to FIG. 6, in one embodiment, the sensor device can have two modes, a fault mode and a test mode. In a specific embodiment, the switching and logic 52 can include logic section 57, fault switch 58, and power switch 59. In fault mode, fault switch 58 is tripped due to a fault sensed by the magnetic sensor 56. The power switch 59 is closed for test mode and fault mode. The logic section 57 can be activated when the distribution line loses its magnetic field, which is a sign that a fault has occurred in the area of the sensor device. The logic section 57 can also be provided to modulate the signal for communication. In one embodiment, when a fault is detected, the sensor device can transmit a signal via the fiber optic cable 60. The signal can contain an identification code for the sensor device, which allows easy identification of location.

In a specific embodiment, software at a control center can be used to locate the source of the signal on the distribution network using the identification code. The software at the control center can analyze all the data coming in from the sensors. Once a fault occurs, many sensors may trip and send signals back to the control center. Preferably, the software can be capable of determining the location of the sensors, and based upon the flow of fault signals will be able to locate the origin of the fault. In an embodiment, the determination can incorporate the time differences between received signals indicating power failure from different locations on the power grid in order to determine a time sequence of where power failed. This capability allows faster repair of service.

Referring again to FIG. 6, in a further embodiment, the sensor device can incorporate an onboard testing mode, which can provide a signal to the control center at predetermined intervals of time. This test signal can allow the system to maintain its readiness, and alert the operators to a sensor failure. In an embodiment, the sensor device can send a ping to the system to notify that it is operational. In a further embodiment, the sensor device can provide a distress call if it detects issues within itself.

In one embodiment, optical wavelength division and electrical frequency division can be used to assist the control center to quickly locate faults. In an embodiment, fault location determination can be accomplished using wavelength identification such that calculations of time difference of optical signals, magnitudes, and/or phases are not required to accurately determine a fault.

Accordingly the device and method for fault detection of power lines according to various embodiment of the subject invention can provide fast detection of faults at a low cost, low power, minimal output, non-destructive, and non-interference design. Furthermore, the device and method for fault detection of power lines according to various embodiments of the subject invention can be implemented without new wires and using existing power lines.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. A system for power line fault detection, comprising:
a plurality of sensor devices located at a corresponding plurality of positions proximate a power grid, each of the plurality of sensor devices comprising:
   a detector, wherein the detector detects a power line fault, and
   a transmitter, wherein the transmitter comprises an optical signal generator,
wherein each of the plurality of positions is assigned an identifier, wherein the optical signal generator generates a corresponding optical signal with the assigned identifier upon the corresponding detector detecting a power line fault; and
a network of optical fibers for conveying the plurality of optical signals from the plurality of sensor devices to a control center.

2. The system according to claim 1, wherein a subset of the plurality of positions along the power grid are proximate manholes.

3. The system according to claim 1, wherein at least one optical signal generator comprises an LED.

4. The system according to claim 1, wherein at least one optical signal generator comprises a laser.

5. The system according to claim 1, wherein the optical signal generator generates optical signals incorporating optical wavelength division.

6. The system according to claim 1, wherein the optical signal generator generates optical signals incorporating electrical frequency division.

7. The system according to claim 1, wherein the transmitter further comprises a frequency generator for generating a particular identification frequency, wherein the frequency generator causes the optical signal generator to generate an optical signal having the particular identification frequency upon the detector detecting a power line fault.

8. The system according to claim 7, wherein the frequency generator comprises a local oscillator.

9. The system according to claim 7, wherein the frequency generator comprises a digital clock generator.

10. The system according to claim 1, wherein the power grid comprises multiple zones, wherein each of the plurality of sensor devices has a color wavelength identifier corresponding to the one of the multiple zones in which it is located.

11. The system according to claim 1, wherein the detector comprises a magnetic field detector capable of detecting magnetic fields generated by a power line.

12. The system according to claim 1, wherein the detector comprises an electric field detector capable of detecting current flow in a power line.

13. The system according to claim 1, wherein the detector uses an optical fiber of the network of optical fibers for detecting a power line fault.

14. The system according to claim 13, wherein the optical fiber of the network of the optical fibers is used for detecting the temperature distribution of a power line.

15. The system according to claim 14, further comprising a pulsed laser, wherein Raman scattering with the pulsed laser is used for detecting the temperature distribution of the power line.

16. The system according to claim 13, wherein the optical fiber of the network of the optical fibers is used for detecting hot spots in a power line.

17. The system according to claim 16, further comprising a pulsed laser, wherein Raman scattering with the pulsed laser is used for detecting hot spots in the power line.

18. The system according to claim 1, further comprising a power supply for supplying power to one or more of the plurality of sensor devices, wherein at least a portion of the supplied power is harvested from radiation energy from a power line.

19. The system according to claim 1, further comprising a secondary network of optical fibers for conveying a corresponding second plurality of optical signals from the plurality of sensor devices to the control center for redundancy.

20. A method for power line fault detection, comprising:
locating a plurality of sensor devices at a corresponding plurality of positions proximate a power grid, each of the plurality of sensor devices comprising:
   a detector, wherein the detector detects a power line fault, and
   a transmitter, wherein the transmitter comprises an optical signal generator, wherein each of the plurality of positions is assigned an identifier;

generating a corresponding optical signal via the optical signal generator with the assigned identifier upon the corresponding detector detecting a power line fault; and conveying the plurality of optical signals from the plurality of sensor devices via a network of optical fibers to a control center.

21. The method according to claim 20, wherein a subset of the plurality of positions along the power grid are proximate manholes.

22. The method according to claim 20, wherein at least one optical signal generator comprises an LED.

23. The method according to claim 20, wherein at least one optical signal generator comprises a laser.

24. The method according to claim 20, wherein generating a corresponding optical signal comprises generating optical signals incorporating optical wavelength division.

25. The method according to claim 20, wherein generating a corresponding optical signal comprises generating optical signals incorporating electrical frequency division.

26. The method according to claim 20, wherein the transmitter further comprises a frequency generator for generating a particular identification frequency, wherein the frequency generator causes the optical signal generator to generate an optical signal having the particular identification frequency upon the detector detecting a power line fault.

27. The method according to claim 26, wherein the frequency generator comprises a local oscillator.

28. The method according to claim 26, wherein the frequency generator comprises a digital clock generator.

29. The method according to claim 20, wherein the power grid comprises multiple zones, wherein each of the plurality of sensor devices has a color wavelength identifier corresponding to the one of the multiple zones in which it is located.

30. The method according to claim 20, wherein the detector comprises a magnetic field detector capable of detecting magnetic fields generated by a power line.

31. The method according to claim 20, wherein the detector comprises an electric field detector capable of detecting current flow in a power line.

32. The method according to claim 20, wherein the detector uses an optical fiber of the network of optical fibers for detecting a power line fault.

33. The method according to claim 32, wherein the optical fiber of the network of the optical fibers is used for detecting the temperature distribution of a power line.

34. The method according to claim 33, further comprising a pulsed laser, wherein Raman scattering with the pulsed laser is used for detecting the temperature distribution of the power line.

35. The method according to claim 32, wherein the optical fiber of the network of the optical fibers is used for detecting hot spots in a power line.

36. The method according to claim 35, further comprising a pulsed laser, wherein Raman scattering with the pulsed laser is used for detecting hot spots in the power line.

37. The method according to claim 20, further comprising a power supply for supplying power to one or more of the plurality of sensor devices, wherein at least a portion of the supplied power is harvested from radiation energy from a power line.

38. The method according to claim 20, further comprising a secondary network of optical fibers for conveying a corresponding second plurality of optical signals from the plurality of sensor devices to the control center for redundancy.

* * * * *